United States Patent [19]
Shiba et al.

[11] Patent Number: 5,290,667
[45] Date of Patent: Mar. 1, 1994

[54] METHOD FOR PRODUCING INK JET RECORDING HEAD

[75] Inventors: Shoji Shiba, Sagamihara; Masashi Miyagawa, Yokohama; Isao Imamura, Yokohama; Akio Kashiwazaki, Yokohama, all of Japan

[73] Assignee: Canon Kabushiki Kaisha, Tokyo, Japan

[21] Appl. No.: 983,753

[22] Filed: Dec. 1, 1992

[30] Foreign Application Priority Data

Dec. 3, 1991 [JP] Japan ................ 3-319290
May 28, 1992 [JP] Japan ................ 4-137131
Jun. 24, 1992 [JP] Japan ................ 4-166401

[51] Int. Cl.$^5$ ............................. G03C 5/00
[52] U.S. Cl. ............................. 430/328; 430/320; 430/324; 430/325
[58] Field of Search ............ 430/270, 295, 313, 320, 430/322, 323, 324, 325, 328, 330; 346/1.1, 140 R

[56] References Cited

U.S. PATENT DOCUMENTS

| | | | |
|---|---|---|---|
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,609,427 | 9/1986 | Inamoto et al. | 430/313 |
| 4,666,823 | 5/1987 | Yokota et al. | 430/320 |
| 4,723,129 | 2/1988 | Endo et al. | 346/1.1 |
| 4,740,796 | 4/1988 | Endo et al. | 346/1.1 |

FOREIGN PATENT DOCUMENTS

| | | |
|---|---|---|
| 0278059 | 8/1988 | European Pat. Off. . |
| 54-056847 | 5/1979 | Japan . |
| 59-123670 | 7/1984 | Japan . |
| 59-138461 | 8/1984 | Japan . |
| 60-071260 | 4/1985 | Japan . |
| 61-154947 | 7/1986 | Japan . |
| 62-048018 | 3/1987 | Japan . |
| 62-054917 | 3/1987 | Japan . |
| 62-253457 | 11/1987 | Japan . |
| 63-208842 | 8/1988 | Japan . |

OTHER PUBLICATIONS

Solid State Technology, Onodera et al., "Outgas Free Photoresist Processing", vol. 34, No. 2, pp. S7–S10, Feb. 1991.
Design Engineering, "Mini gears show their mettle", p. 24, Jun. 1991.

Primary Examiner—Hoa Van Le
Attorney, Agent, or Firm—Fitzpatrick, Cella, Harper & Scinto

[57] ABSTRACT

In the preparation of a ink jet recording head by coating positive photoresist containing naphthoquinone diazide on a substrate, patterning the positive photoresist, then coating a photocurable material for liquid path formation, photocuring said material and dissolving the patterned photoresist thereby forming liquid paths, the patterned positive photoresist is subjected to flush exposure and degassing prior to the coating of the liquid path forming material in order to discharge the bubbles from the photoresist and to prevent eventual deformation of said material by the migrating bubbles generated from the positive photoresist.

5 Claims, 3 Drawing Sheets

METHOD FOR PRODUCING INK JET RECORDING HEAD

BACKGROUND OF THE INVENTION

1. Field of the Invention

The present invention relates to a method for producing a liquid discharge recording head for discharging liquid droplets, adapted for use in a liquid discharge recording apparatus which effects recording by discharging droplets of recording liquid such as ink from discharge openings and depositing said liquid droplets onto a recording medium such as paper.

2. Related Background Art

The liquid discharge recording head employed in the liquid discharge recording (ink jet recording) is generally provided with fine liquid discharge apertures (orifices), liquid paths and energy generating units for liquid discharge, provided in a part of said liquid paths. For producing such recording head, there is known a method as disclosed in the Japanese Patent Laid-open Application Nos. 61-154947 and 62-253457, which will be explained in the following with reference to FIG. 1

At first, on a substrate 1, there is formed a layer of photosensitive resin (positive photoresist) 2 (FIG. 1A). The substrate is composed for example of glass, ceramics, plastics or metal, and is provided, in desired positions thereon, with a desired number of liquid discharge energy generating elements such as electrothermal converters or piezoelectric elements, and with wirings for connecting said elements with control signal input electrodes for activating said elements. Then the photosensitive resin layer on the substrate 1 is exposed to light through a mask 3 (FIG. 1B), and is patterned by development, whereby a solid layer is formed on the substrate (FIG. 1C). Then the patterned solid layer is covered with a liquid path forming material 5 curable with an actinic energy ray (FIG. 1D), and the material is cured by the irradiation with actinic energy ray (FIG. 1E). Finally the patterned solid layer is dissolved with an organic solvent such as halogenated hydrocarbon, ketone, ester, ether or alcohol, or aqueous alkali solution such as of sodium hydroxide or potassium hydroxide, whereby liquid paths 6 are formed (FIG. 1F).

The above-explained method generally employs, as the photosensitive resin material for forming the solid layer, positive photoresist containing a naphthoquinone diazide derivative. Said naphthoquinone diazide derivative, employed in the positive photoresist, is known to generate nitrogen gas, according to the following chemical reaction, under the light irradiation in air at room temperature:

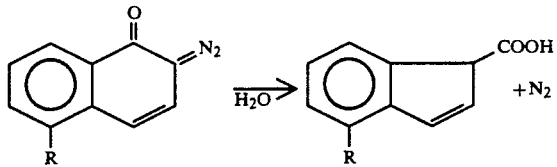

As indene carboxylic acid generated by the above-mentioned reaction is easily soluble in aqueous alkali solution, the exposed area can be easily removed with aqueous alkali solution, whereby the patterning can be achieved.

On the other hand, if the liquid path forming material, to be coated on the patterned solid layer, is curable with light, there is required flush exposure for curing of said material. In such flush exposure, the exposing light also reaches the patterned positive photoresist, thus inducing the above-mentioned reaction and generating nitrogen gas therein. Since the photosensitivity of positive photoresist is generally higher than that of the light-curable material, the nitrogen gas generated from the positive photoresist intrudes the liquid path forming material provided on the patterned photoresist and remain as bubbles in said material when it is cured. For this reason, there are encountered drawbacks of deformation of the liquid paths finally formed by the removal of the patterned positive photoresist, and a lowered strength of the recording head, eventually leading to the breakage thereof.

SUMMARY OF THE INVENTION

The principal object of the present invention is to provide a method for producing an ink jet recording head of a high reliability, without intrusion of bubbles into the light path forming material even in case of employing positive photo-resist containing the naphthoquinone diazide derivative.

The above-mentioned object can be attained, according to the present invention, by a method for forming an ink jet recording head by forming a photosensitive layer consisting of positive photoresist containing a naphthoquinone diazide derivative on a substrate bearing thereon energy generating elements for liquid discharge, patterning said photoresist by exposure and development thereof, coating a photocurable liquid path forming material on thus obtained photoresist pattern, effecting flush exposure to cure said liquid path forming material and dissolving the patterned positive photoresist therefrom liquid path, which comprises, after the patterning of the photoresist, effecting flush exposure on the resist pattern and coating the photocurable liquid path forming material on the resist pattern after the photodecomposition.

DETAILED DESCRIPTION OF THE PREFERRED EMBODIMENTS

Figure 3:
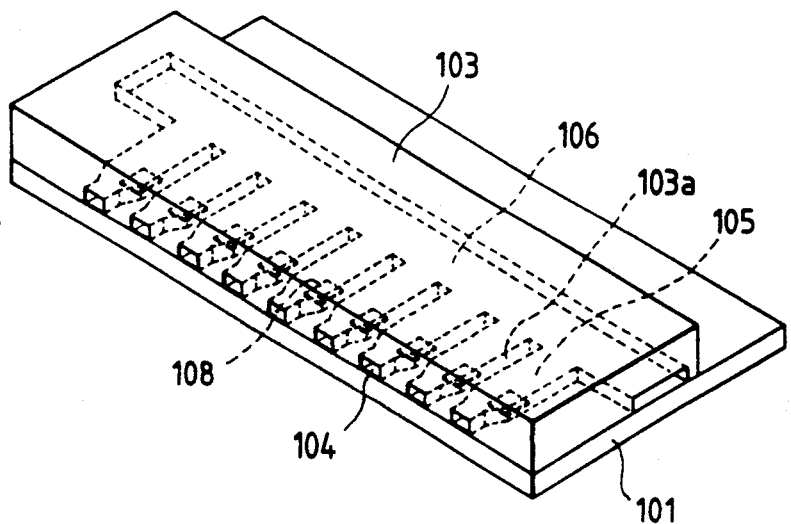
FIG. 3 is a schematic perspective view of an example of the configuration of the ink jet recording head.

At first reference is made to FIG. 3 for explaining a representative configuration of the ink jet recording head to which the present invention is applicable.

In the recording head shown in FIG. 3, there are formed, on a substrate 101, electrothermal converters 108 for generating thermal energy and electrode wirings (not shown) for supplying electric power to said converters. On the face bearing said electrothermal converters etc., there is laminated a recess forming layer 103, for forming recesses constituting liquid paths. By the lamination of said recess forming layer 103 on the substrate 101, there are formed discharge openings 104 respectively corresponding to the electrothermal converters 108, liquid paths 105 respectively communicating with said discharge openings and respectively containing said electrothermal converters 108, and a common liquid chamber 106 communicating with said liquid paths 105 and serving to temporarily storing the ink. Said liquid paths 105 are mutually separated by partition walls 103a constituting parts of the recess forming layer 103.

Figure 1A:
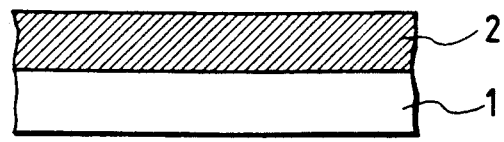
FIGS. 1A to 1F are schematic cross-sectional views showing the steps of a conventional method for producing an ink jet recording head.
Figure 1B:
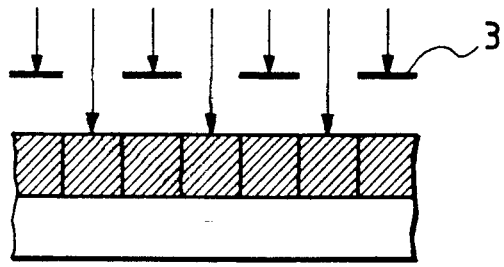
Figure 1C:
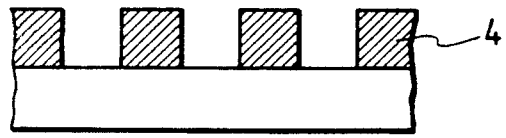
Figure 1D:
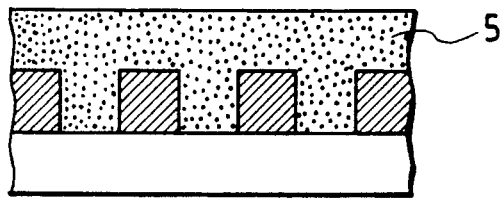
Figure 1E:
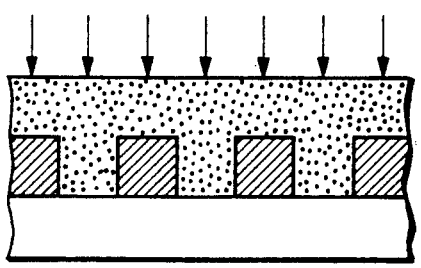
Figure 1F:
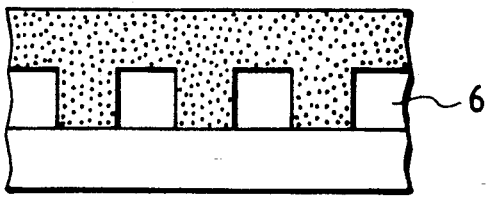
Figure 2:
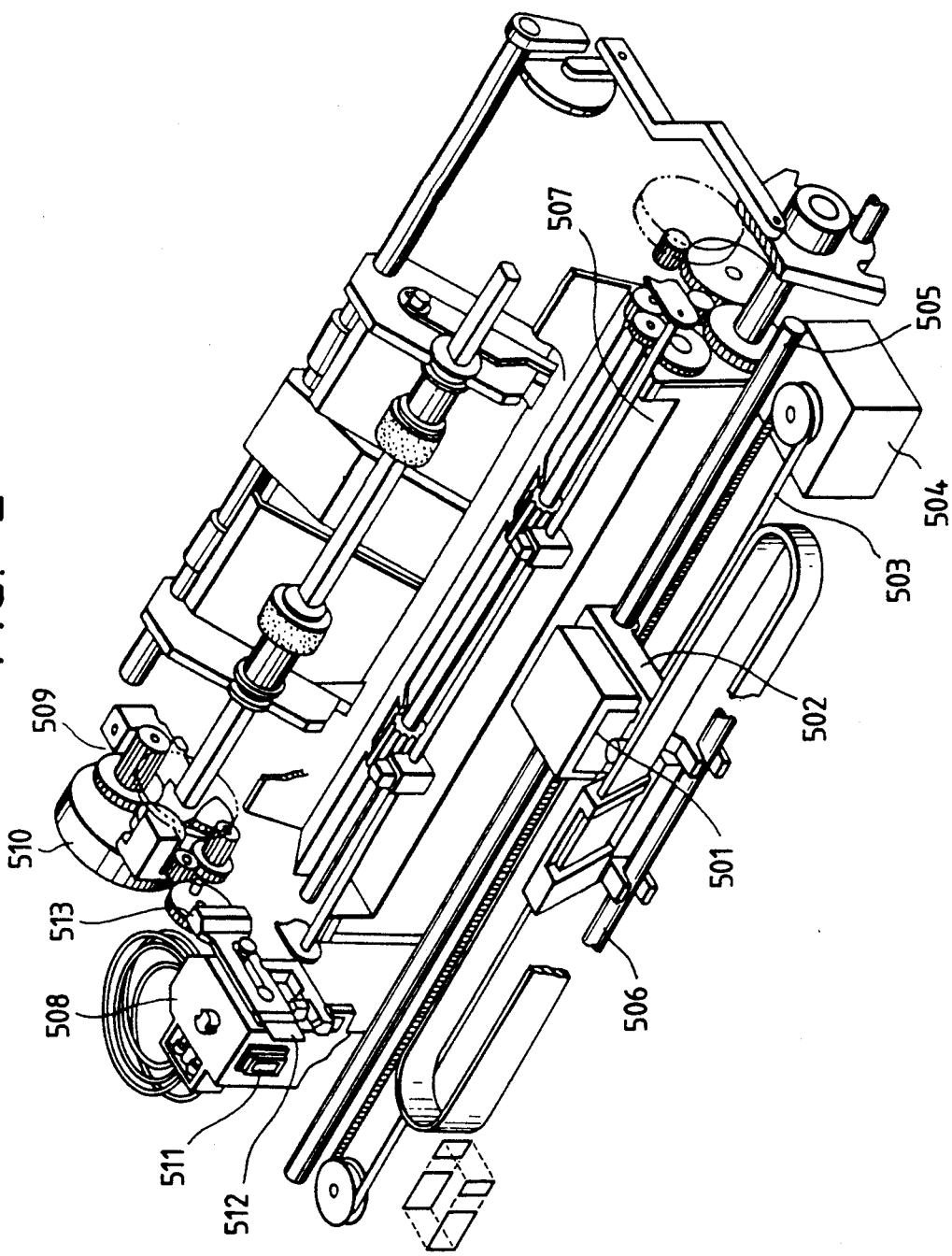
FIG. 2 is a perspective view of an example of the ink jet recording apparatus loaded with the ink jet recording head of the present invention.

FIG. 2 is a perspective view of an ink jet recording apparatus equipped with the recording head shown in FIG. 3.

An ink jet head cartridge (IJC) 501 is provided with a group of nozzles for effecting ink discharge to the recording face of a recording sheet transported onto a platen 507. A head carriage (HC) 502 supporting the IJC 501 is connected to a part of a driving belt 504 for transmitting the driving force of a driving motor 503, and is rendered slidable along two mutually parallel guide shafts 505, 506, whereby the IJC 501 can reciprocate over the entire width of the recording sheet.

A head recovery unit 508 is positioned at an end of the moving path of the IJC 501, for example at a positioned opposed to the IJC at the home position thereof. The head recovery unit 508 is activated by the driving force of a motor 510 transmitted through a transmission mechanism 509, thereby capping the IJC 501. In combination with the capping operation on the IJC 501 by a capping unit 511 of the head recovery unit 508, there is conducted ink suction by suitable suction means provided in the head recovery unit 508 or ink pressurizing by suitable pressurizing means provided in an ink supply path to the IJC 501, thereby effecting a discharge recovery operation such as the removal of viscosified ink present in the nozzles, by forced discharge of ink from the discharge openings. Also the capping after the end of recording operation serves to protect the recording head.

A cleaning lever 512, provided at a side of the head recovery unit 508, is supported, through a cantilever mechanism, by a blade support member 513, and is rendered engageable with the ink discharge face of the IJC 501 by the activation by the motor 510 and the transmission mechanism 509. Thus the blade 512 is made to protrude into the moving path of the IJC 501 at a suitable timing in the course of recording operation thereof or after the discharge recovery operation by the discharge recovery unit 508, thereby wiping off the dews, liquid or dusts from the ink discharge face of the IJC 501, by the movement thereof.

FIGS. 4A to 4E provide schematic cross-sectional views showing the steps of the method of the present invention for producing an ink jet recording head.

Figure 4A:
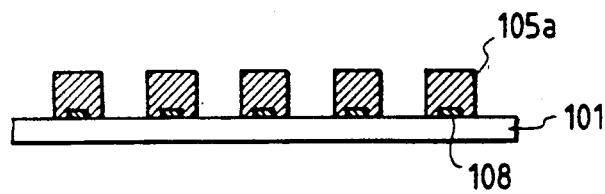
FIGS. 4A to 4E are schematic cross-sectional views showing the steps, in the sequential order, of the method for producing an ink jet recording head of the present invention.

At first, as shown in FIG. 4A a solid layer is formed as in the aforementioned step (A), on a substrate 101 bearing thereon electrothermal converters 108 serving as the energy generating elements for ink discharge. The substrate 101 may be composed of glass, ceramics, plastics or metals, as long as a certain hardness is secured. Also said solid layer is composed, as explained before, of positive photoresist containing a naphthoquinone diazide derivative. Examples of such positive photoresist include PMER P-G7000 series (trade name) supplied by Tokyo Oka, AZ-series (trade name) supplied by Hoechst, TF-20 (trade name) supplied by Shipley and ULTRAMAC EL2025 series (trade name) supplied by Toray-McDermid. Said photoresist may be applied onto the substrate 101 by a roller coater, a spin coater or a spray.

Figure 4B:
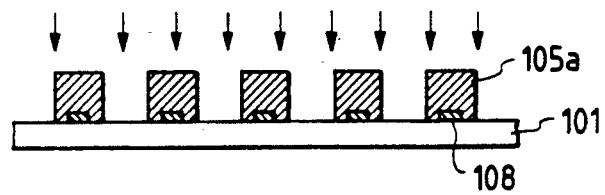

After the solid layer 105a is formed by coating, baking, exposure and development of the photoresist as shown in FIG. 4A, an exposure of a suitable amount is given as shown in FIG. 4B. Heating may be conducted at the same time, in order to accelerate the discharge of bubbles from the photoresist. However, the heating temperature has to be such as not to harden the photoresist, since otherwise the removal thereof becomes afterwards. These steps allow to generate gas from the solid layer 105a by the aforementioned reaction.

Such irradiation with actinic light is described, as the hardening method for the resist film containing o-naphthoquinone diazide as the photosensitizer, for example in the Japanese Patent Laid-open Application Nos. 62-48018 and 62-54917.

In this operation, a deficient exposure, being unable to generate gas completely, results in gas formation at the exposure of the photocurable material. Also an excessive exposure results in thermal flow of the solid layer 105A, whereby the patterns are degradated and fine liquid paths cannot be formed with a high accuracy. Particularly in case the positive photoresist has a large thickness or a high content of the naphthoquinone diazide derivative, said photoresist is deformed by the generation of a large amount of bubbles, whereby the liquid paths finally formed by the removal of the patterned positive photoresist are deformed.

Consequently, the amount of exposure in this operation is preferably enough for photodecomposing all the positive photoresist but in such a level as not to cause rapid bubble generation inducing the deformation of photoresist or thermal flow thereof.

Also in case the positive photoresist has a large thickness or a high content of the naphthoquinone diazide derivative, the deformation of photoresist can be prevented by exposure for a long time or plural exposures with a low exposing intensity.

After the flush exposure of the positive photoresist, the bubbles generated by photodecomposition often remain in the positive photoresist. It is therefore necessary to discharge the bubbles from the positive photoresist, after the flush exposure thereof. After said flush exposure, the discharge of bubbles proceeds, though gradually, by standing of the processed substrate. However, such spontaneous bubble discharge by standing of the substrate is very slow, requiring a long time with an increase in the thickness of photoresist film and lacking reproducibility. Therefore, a degassing process after the flush exposure of the photoresist pattern is effective for efficient preparation of the ink jet recording head. Also in case a thick photoresist film is employed, the degassing process combined with the aforementioned plural exposure with a low exposing intensity is effective for obtaining a further improved ink jet recording head. For completing the degassing within a short time, in consideration of the process margin, the processed substrate is preferably exposed to a reduced pressure, preferably within a range of 0.01 to 10 mmHg abs., preferably for a period of 10 minutes to 2 hours.

Figure 4C:
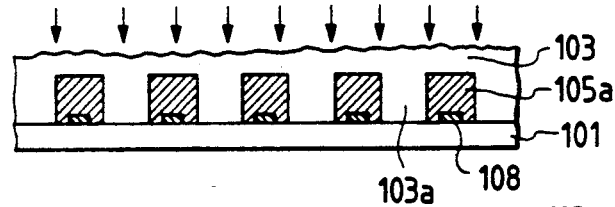

After the sensitizer in the solid layer 105a is completed reacted in the above-explained manner, a material curable for example with an actinic energy ray is coated, as shown in FIG. 4C, on a face of the substrate 101, bearing the solid layer 105a, for forming the recess forming layer 103.

The recess forming layer 103 may be composed of any material capable of covering the solid layer, but is in practice suitably selected in consideration of the adhesion to the substrate, mechanical strength, dimensional stability and corrosion resistance. More specifically there is preferred a liquid material curable with an actinic energy ray, and examples of such material include epoxy resin, acrylic resin, diglycol dialkylcarbonate resin, unsaturated polyester resin, polyurethane resin, polyimide resin, melamine resin, phenolic resin and urea resin.

Said liquid material curable with actinic energy ray is coated on the substrate 101 and on the solid layer 105a, with a desired thickness, by known means such as curtain coating, roller coating or spray coating. Said coating is preferably conducted with prevention of air mixing, after said curable material is degassed in advance.

Figure 4D:
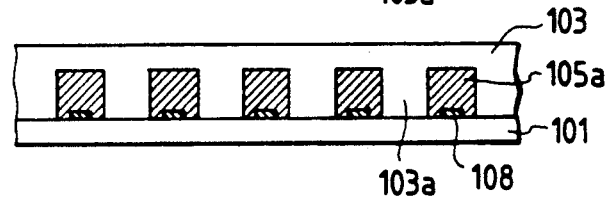

Then, as shown in FIG. 4D, said recess forming layer 103 is cured by exposure to light. Since the positive photoresist is completely reacted by the exposure in the preceding step shown in FIG. 4B, the bubble generation does not take place anew in the step shown in FIG. 4D.

Figure 4E:
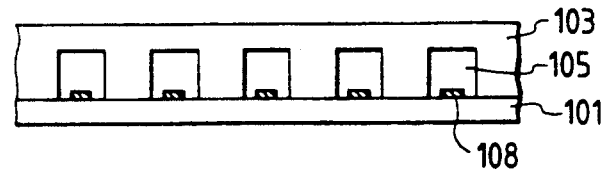

Then, as shown in FIG. 4E, the solid layer 105a is removed from the substrate 101 bearing said solid layer 105a and the recess forming layer 103, thereby forming the liquid paths 105.

The removing method for the solid layer 105a is not limitative, but a preferred example is the method of immersing the substrate in liquid capable of dissolving, swelling or stripping the solid layer 105a. If necessary, there may be employed, in combination, other removing means such as heating, ultrasonic treatment or agitation.

Among various ink jet recording methods, the present invention brings about a particularly excellent effect when applied to a recording head or system provided with means for generating thermal energy (for example electrothermal converter or laser beam) as the energy for ink discharge and inducing a state change of ink by said thermal energy, since such method can achieve a higher density and a finer definition of the recording.

The principle and representative configuration of said system are disclosed, for example, in the U.S. Pat. Nos. 4,723,129 and 4,740,796. This system is applicable to so-called on-demand recording or continuous recording, but is particularly effective in the on-demand recording because, in response to the application of at least a drive signal representing the recording information to an electrothermal converter element positioned corresponding to a liquid channel or a sheet containing liquid (ink) therein, said element generates thermal energy capable of causing a rapid temperature increase exceeding the nucleus boiling point, thereby inducing film boiling on a heat action surface of the recording head and thus forming a bubble in said liquid (ink), in one-to-one correspondence with said drive signal. Said liquid (ink) is discharged through a discharge opening by the growth and contraction of said bubble, thereby forming at least a liquid droplet. Said drive signal is preferably formed as a pulse, as it realizes instantaneous growth and contraction of the bubble, thereby attaining highly responsive discharge of the liquid (ink). Such pulse-shaped drive signal is preferably that disclosed in the U.S. Pat. Nos. 4,463,359 and 4,345,262. Also the conditions described in the U.S. Pat. No. 4,313,124 relative to the temperature increase rate of said heat action surface allows to obtain further improved recording.

The configuration of the recording head is given by the combinations of the liquid discharge openings, liquid channels and electrothermal converter elements with linear or rectangular liquid channels, disclosed in the above-mentioned patents, but a configuration disclosed in the U.S. Pat. No. 4,558,333 in which the heat action part is positioned in a flexed area, and a configuration disclosed in the U.S. Pat. No. 4,459,600 also belong to the present invention. Furthermore the present invention is effective in a structure disclosed in the Japanese Patent Laid-open Application No. 59-123670, having a slit common to plural electrothermal converter elements as a discharge opening therefor, or in a structure disclosed in the Japanese Patent Laid-open Application No. 59-138461, having an aperture for absorbing the pressure wave of thermal energy, in correspondence with each discharge opening. This is because the present invention enables secure and efficient recording, regardless of the shape of the recording head.

Furthermore, the present invention is also effective to a full-line recording head, having a length corresponding to the maximum width of recording medium recordable on the recording apparatus. Such recording head may be obtained by plural recording heads so combined as to obtain the required length, or may be constructed as a single integral recording head.

The present invention is effective, in the category of serial recording head mentioned above, in a recording head fixed in the main body of the recording apparatus, or in a recording head of interchangeable chip type, which can receive ink supply from the main apparatus and can be electrically connected therewith upon mounting on said main apparatus, or in a recording head of cartridge type in which an ink cartridge is integrally constructed with the recording head.

Also the recording apparatus is preferably provided with the discharge recovery means and other auxiliary means for the recording head, since the effects of the present invention can be further stabilized. Examples of such means include capping means, cleaning means pressurizing or suction means, preliminary heating means composed of electrothermal converter element and/or another heating device, and means for effecting an idle ink discharge independent from the recording operation.

Furthermore, the number of recording head is not limited to one corresponding to the ink of a single color, but may also be plural corresponding to plural inks different in color or in density. Thus the present invention is not limited to a recording mode for recording a single main color such as black, but is extremely effective also to the recording apparatus provided with at least either of the recording mode for recording plural different colors and the recording mode for recording full color by color mixing, wherein the recording head may be integrally constructed or composed of plural units.

Furthermore, the recording head of the present invention is applicable, not only to liquid ink, but also to ink which is solid below room temperature but softens or liquefies at room temperature, or which softens or liquefies within a temperature control range from 30° to 70° C., which is ordinarily adopted in the ink jet recording. Besides the recording head of the present invention can employ ink liquefied by thermal energy provided corresponding to the recording signal, such as the ink in which the temperature increase by thermal energy is intentionally absorbed by the state change from solid to liquid, or the ink which remains solid in the unused state for the purpose of prevention of ink evaporation, or the ink which starts to solidify upon reaching the recording sheet. In these cases the ink may be supported as solid or liquid in recesses or holes of a porous sheet, as described in the Japanese Patent Laid-open Applications Nos. 54-56847 and 60-71260, and placed in an opposed state to the electrothermal converter element. The present invention is most effective when the above-mentioned film boiling is induced in the ink of the above-mentioned forms.

Furthermore, the ink jet recording apparatus of the present invention may be employed not only as an image output terminal for an information processing equipment such as a computer, but may also assume the form of a copying apparatus in combination with an image reader or a facsimile apparatus provided with transmitting and receiving functions.

In the following the present invention will be clarified in more details by examples thereof.

EXAMPLE 1

On a glass substrate bearing electrothermal converter elements as the energy generating elements, positive photoresist AZ-4903 (supplied by Hoechst) was spin coated to obtain a film thickness of 20 $\mu$m and was prebaked at 90° C. for 20 minutes in an oven, thereby forming a resist layer. Said resist layer was exposed to a nozzle pattern through a mask, with an exposure amount of 200 mJ/cm$^2$ with a Canon mask aligner PLA-501, then developed with 0.75 wt. % aqueous solution of sodium hydroxide, rinsed with DI water and pastbaked at 70° C. for 30 minutes in an oven to obtain a resist pattern.

Said resist pattern was then flush exposed to light of 500 mJ/cm$^2$, and was let to stand for 24 hours in a cleanroom (temperature 23° C., humidity 50%). Subsequently, said resist pattern was overcoated with a photocurable material for liquid path formation, consisting of epoxy resins of Union Carbide Japan:

| | |
|---|---|
| Cyracure UVR-6110 | 40 parts by weight |
| Cyracure UVR-6200 | 20 parts by weight |
| Cyracure UVR-6351 | 40 parts by weight and |
| triphenylphonium hexafluoroantimonate | 1 part by weight. | and said material was cured by flush exposure to light of 8.5 J/cm$^2$. Subsequently the processed substrate was immersed in 3.0 wt. % aqueous solution of sodium hydroxide to dissolve the resist pattern.

The fine nozzles prepared in this manner did not show any bubbles in the material constituting the liquid paths, in the observation under an optical microscope. Also the nozzles were highly precise and high in reliability. Furthermore the ink jet recording head prepared in this manner was capable of stable recording.

EXAMPLE 2

An ink jet recording head was prepared in the same manner as in the example 1, except that the resist pattern after flush exposure was subjected to a degassing process for 30 minutes in vacuum of 0.1 mmHg instead of standing in the cleanroom.

In the observation of thus prepared fine nozzles under an optical microscope, the material constituting the liquid paths did not show any bubbles. The prepared nozzles were highly precise and high in reliability. Furthermore the ink jet recording head prepared in this manner was capable of stable recording.

EXAMPLE 3

An ink jet recording head was prepared in the same manner as in the example 1, except that the positive photoresist was coated with a thickness of 30 $\mu$m and that the resist pattern was subjected twice to steps of flush exposure to light of 150 mJ/cm$^2$ and degassing for 30 minutes in vacuum of 0.1 mmHg, instead of standing in the cleanroom.

In the observation of thus prepared fine nozzles under an optical microscope, the material constituting the liquid paths did not show any bubbles. The prepared nozzles were highly precise and high in reliability. Furthermore the ink jet recording head prepared in this manner was capable of stable recording.

REFERENCE EXAMPLE 1

An ink jet recording head was prepared in the same manner as in the example 1, except that the resist pattern was covered, immediately after formation thereof, by the material for forming the liquid paths.

In thus prepared fine nozzles, the bubbles were generated from immediately after the coating of the liquid path forming material, and were observed to migrate into said material.

REFERENCE EXAMPLE 2

An ink jet recording head was prepared in the same manner as in the example 1, except that the step of standing in the cleanroom was omitted.

In the observation of thus prepared fine nozzles under an optical microscope, many bubbles were observed in the liquid path forming material, and the nozzles did not retain the original form thereof.

REFERENCE EXAMPLE 3

An ink jet recording head was prepared in the same manner as in the example 1, except that the thickness of positive photoresist was varied to 30 $\mu$m, and that the resist pattern was subjected, after formation thereof, to flush exposure with light of 500 mJ/cm$^2$ and degassing for 30 minutes under vacuum of 0.1 mmHg instead of standing in the cleanroom.

In the observation of thus prepared fine nozzles under an optical microscope, there were observed many bubbles in the liquid path forming material, and the nozzles showed deformation by said bubbles.

What is claimed is:

1. A method for producing an ink jet recording head by forming a photosensitive layer consisting of positive photoresist containing a naphthoquinone diazide derivative on a substrate bearing thereon elements for generating energy for liquid discharge, patterning said photoresist by exposure and development thereof, coating a photocurable material for forming liquid paths on said patterned photoresist, applying flush exposure for curing said liquid path forming material and dissolving said patterned photoresist thereby forming liquid paths, comprising steps of applying, after the patterning of positive photoresist, flush exposure to said photoresist and discharging bubbles from the patterned photoresist, prior to the coating of the photocurable material for forming liquid paths.

2. A method according to claim 1, wherein a degassing process is executed for said bubble discharge.

3. A method for producing an ink jet recording head by forming a photosensitive layer consisting of positive photoresist containing a naphthoquinone diazide derivative on a substrate bearing thereon elements for generating energy for liquid discharge, patterning said photoresist by exposure and development thereof, coating a material for forming liquid paths on said patterned photoresist, curing said material for forming liquid paths and dissolving said patterned positive photoresist thereby forming liquid paths, comprising steps of heating, flush exposure and degassing applied to the patterned positive photoresist containing the naphthoquinone diazide derivative in plural cycles, and then steps of coating said patterned resist with a photocurable material for forming the liquid paths, and applying flush exposure thereby curing said liquid path forming material, prior to the dissolution of the patterned photoresist.

4. A method according to claim 3, wherein the total exposure amount in the flush exposure of the patterned positive photoresist containing naphthoquinone diazide derivative is equal to or larger than the exposure amount employed in the patterning of said photoresist.

5. A method according to claim 3, wherein the degassing, after flush exposure, of the patterned positive photoresist containing the naphthoquinone diazide derivative is conducted by an exposure of the processed substrate to a reduced pressure.

* * * * *

UNITED STATES PATENT AND TRADEMARK OFFICE
CERTIFICATE OF CORRECTION

PATENT NO. : 5,290,667
DATED : March 1, 1994
INVENTOR(S) : SHOJI SHIBA, ET AL.

It is certified that error appears in the above-indentified patent and that said Letters Patent is hereby corrected as shown below:

COLUMN 2

Line 9, "remain" should read --remains--.
    Line 35, "thereforming" should read --thereby forming a--.

COLUMN 4

Lines 10-11, "afterwards." should read --difficult.--.
    Line 22, "degradated" should read --degraded--.
    Line 64, "pleted" should read --pletely--.

COLUMN 6

Line 46, "head" should read --heads--.

COLUMN 7

Line 20, "details" should read --detail--.
    Line 33, "pastbaked" should read --postbaked--.

Signed and Sealed this

Fourth Day of October, 1994

Attest:

BRUCE LEHMAN

*Attesting Officer*    *Commissioner of Patents and Trademarks*